(12) United States Patent
Maki et al.

(10) Patent No.: US 11,133,789 B2
(45) Date of Patent: Sep. 28, 2021

(54) MULTILAYER PIEZOELECTRIC SUBSTRATE

(71) Applicant: SKYWORKS SOLUTIONS, INC., Irvine, CA (US)

(72) Inventors: Keiichi Maki, Suita (JP); Rei Goto, Osaka (JP); Hironori Fukuhara, Ibaraki (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 14 days.

(21) Appl. No.: 16/547,696

(22) Filed: Aug. 22, 2019

(65) Prior Publication Data

US 2020/0067482 A1 Feb. 27, 2020

Related U.S. Application Data

(60) Provisional application No. 62/836,134, filed on Apr. 19, 2019, provisional application No. 62/721,208, filed on Aug. 22, 2018.

(51) Int. Cl.

| | |
|---|---|
| *H03H 9/02* | (2006.01) |
| *H03H 9/25* | (2006.01) |
| *H03H 9/08* | (2006.01) |
| *H03H 9/00* | (2006.01) |
| *H03H 9/05* | (2006.01) |
| *H03H 9/145* | (2006.01) |
| *H03H 9/64* | (2006.01) |
| *H03H 9/72* | (2006.01) |
| *H03H 9/10* | (2006.01) |
| *H04B 1/40* | (2015.01) |

(52) U.S. Cl.
CPC ............ *H03H 9/08* (2013.01); *H03H 9/0009* (2013.01); *H03H 9/02559* (2013.01); *H03H 9/02637* (2013.01); *H03H 9/059* (2013.01); *H03H 9/1092* (2013.01); *H03H 9/145* (2013.01); *H03H 9/25* (2013.01); *H03H 9/64* (2013.01); *H03H 9/725* (2013.01); *H04B 1/40* (2013.01)

(58) Field of Classification Search
CPC .. H03H 9/02; H03H 9/08; H03H 9/25; H03H 9/64; H03H 9/72
See application file for complete search history.

(56) References Cited

U.S. PATENT DOCUMENTS

| | | | |
|---|---|---|---|
| 9,438,201 B2 * | 9/2016 | Hori | H03H 9/25 |
| 2017/0214386 A1 * | 7/2017 | Kido | H03H 9/1014 |
| 2017/0222618 A1 * | 8/2017 | Inoue | H03H 9/02574 |
| 2017/0272051 A1 * | 9/2017 | Kurihara | H03H 9/6483 |
| 2017/0273183 A1 * | 9/2017 | Kawasaki | H05K 1/18 |

* cited by examiner

*Primary Examiner* — Dean O Takaoka
(74) *Attorney, Agent, or Firm* — Lando & Anastasi, LLP

(57) ABSTRACT

An acoustic wave device includes a layered substrate having a piezoelectric material layer bonded to a second material layer including a material having a higher thermal conductivity than the piezoelectric material layer, interdigital transducer electrodes disposed on a surface of the piezoelectric material layer, contact pads disposed on the piezoelectric material layer and in electrical contact with the interdigital transducer electrodes, external bond pads disposed on the second material layer, and conductive vias passing through the layered substrate and providing electrical contact between the contact pads and external bond pads.

18 Claims, 14 Drawing Sheets

MULTILAYER PIEZOELECTRIC SUBSTRATE

CROSS REFERENCE TO RELATED APPLICATIONS

This application claims priority under 35 U.S.C. § 119(e) to U.S. Provisional Patent Application Ser. No. 62/836,134, titled "MULTILAYER PIEZOLELECTRIC SUBSTRATE," filed Apr. 19, 2019 and to U.S. Provisional Patent Application Ser. No. 62/721,208, titled "MULTILAYER PIEZOLELECTRIC SUBSTRATE," filed Aug. 22, 2018, the disclosures of which being incorporated herein in their entireties for all purposes.

BACKGROUND

Technical Field

Embodiments of this disclosure relate to acoustic wave devices and heat dissipation structures for same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front end of a mobile phone can include acoustic wave filters. Two acoustic wave filters can be arranged as a duplexer.

SUMMARY

In accordance with an aspect of the present disclosure there is provided an acoustic wave device. The acoustic wave device comprises a layered substrate including a piezoelectric material layer bonded to a second material layer including a material having a higher thermal conductivity than the piezoelectric material layer, interdigital transducer electrodes disposed on a surface of the piezoelectric material layer, contact pads disposed on the piezoelectric material layer and in electrical contact with the interdigital transducer electrodes, external bond pads disposed on the second material layer, and conductive vias passing through the layered substrate and providing electrical contact between the contact pads and external bond pads.

In some embodiments, the second material layer includes a dielectric material. The second material layer may include spinel. The second material layer may include silicon.

In some embodiments, the acoustic wave device further comprises a cavity defined above the interdigital transducer electrodes by walls and a cap including a dielectric material.

In some embodiments, the acoustic wave device further comprises a bonding layer that bonds the piezoelectric material layer to the second material layer. The bonding layer may comprise silicon dioxide.

In some embodiments, the second material layer has a thickness of between about 50 µm and about 150 µm.

In some embodiments, the piezoelectric material layer has a thickness of between about 0.3 µm and about 20 µm.

In some embodiments, the acoustic wave device is configured as a surface acoustic wave resonator.

In some embodiments, a radio frequency filter includes the surface acoustic wave resonator. An electronics module may include the radio frequency filter. An electronic device may include the electronics module.

In accordance with another aspect, there is provided a radio frequency filter. The radio frequency filter comprises at least one acoustic wave device. The at least one acoustic wave device includes a layered substrate including a piezoelectric material layer bonded to a second material layer including a material having a higher thermal conductivity than the piezoelectric material layer, interdigital transducer electrodes disposed on a surface of the piezoelectric material layer, contact pads disposed on the piezoelectric material layer and in electrical contact with the interdigital transducer electrodes, external bond pads disposed on the second material layer, and conductive vias passing through the layered substrate and providing electrical contact between the contact pads and external bond pads.

In accordance with another aspect, there is provided an electronics module. The electronics module comprises at least one radio frequency filter including at least one acoustic wave device. The at least one acoustic wave device includes a layered substrate including a piezoelectric material layer bonded to a second material layer including a material having a higher thermal conductivity than the piezoelectric material layer, interdigital transducer electrodes disposed on a surface of the piezoelectric material layer, contact pads disposed on the piezoelectric material layer and in electrical contact with the interdigital transducer electrodes, external bond pads disposed on the second material layer, and conductive vias passing through the layered substrate and providing electrical contact between the contact pads and external bond pads.

In accordance with another aspect, there is provided an acoustic wave device. The acoustic wave device comprises a layered substrate including a piezoelectric material layer bonded to a second material layer including a material having a higher thermal conductivity than the piezoelectric material layer, interdigital transducer electrodes disposed on a surface of the piezoelectric material layer, contact pads disposed on the piezoelectric material layer and in electrical contact with the interdigital transducer electrodes, a cavity defined above the interdigital transducer electrodes by walls and a cap including a dielectric material, external bond pads disposed on the cap on an opposite side of the cap from the cavity, and conductive vias passing through the cap and providing electrical contact between the contact pads and external bond pads.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
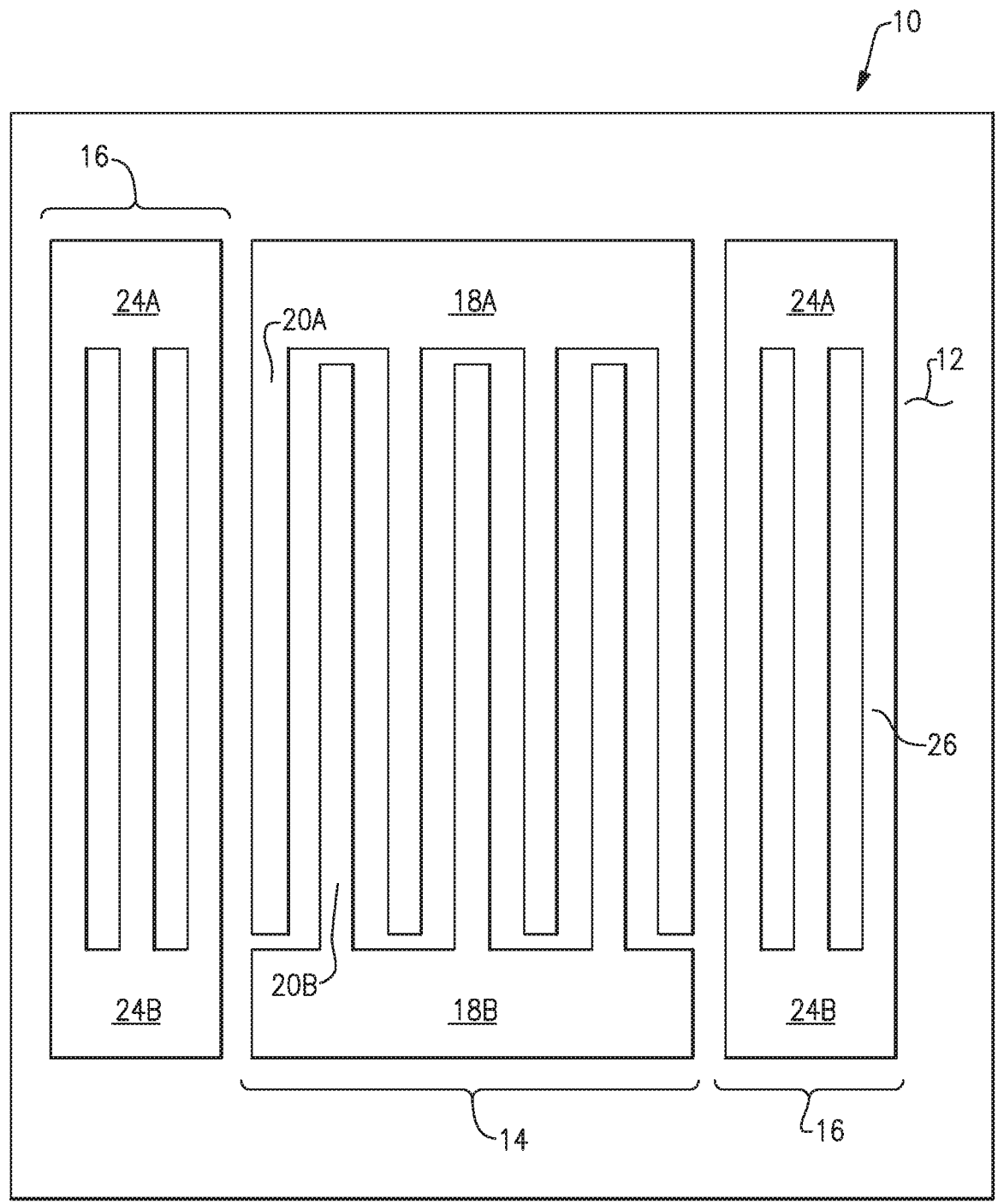
FIG. 1A is a simplified plan view of an example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1A is a plan view of a surface acoustic wave (SAW) resonator 10 such as might be used in a SAW filter, duplexer, balun, etc.

Acoustic wave resonator 10 is formed on a piezoelectric substrate, for example, a lithium tantalate (LiTaO3) or lithium niobate (LiNbO3) substrate 12 and includes Interdigital Transducer (IDT) electrodes 14 and reflector electrodes 16. In use, the IDT electrodes 14 excite a main acoustic wave having a wavelength λ along a surface of the piezoelectric substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first bus bar electrode 18A and a second bus bar electrode 18B facing first bus bar electrode 18A. The bus bar electrodes 18A, 18B may be referred to herein and labelled in the figures as busbar electrode 18. The IDT electrodes 14 further include first electrode fingers 20A extending from the first bus bar electrode 18A toward the second bus bar electrode 18B, and second electrode fingers 20B extending from the second bus bar electrode 18B toward the first bus bar electrode 18A.

The reflector electrodes 16 (also referred to as reflector gratings) each include a first reflector bus bar electrode 24A and a second reflector bus bar electrode 24B (collectively referred to herein as reflector bus bar electrode 24) and reflector fingers 26 extending between and electrically coupling the first bus bar electrode 24A and the second bus bar electrode 24B.

Figure 1B:
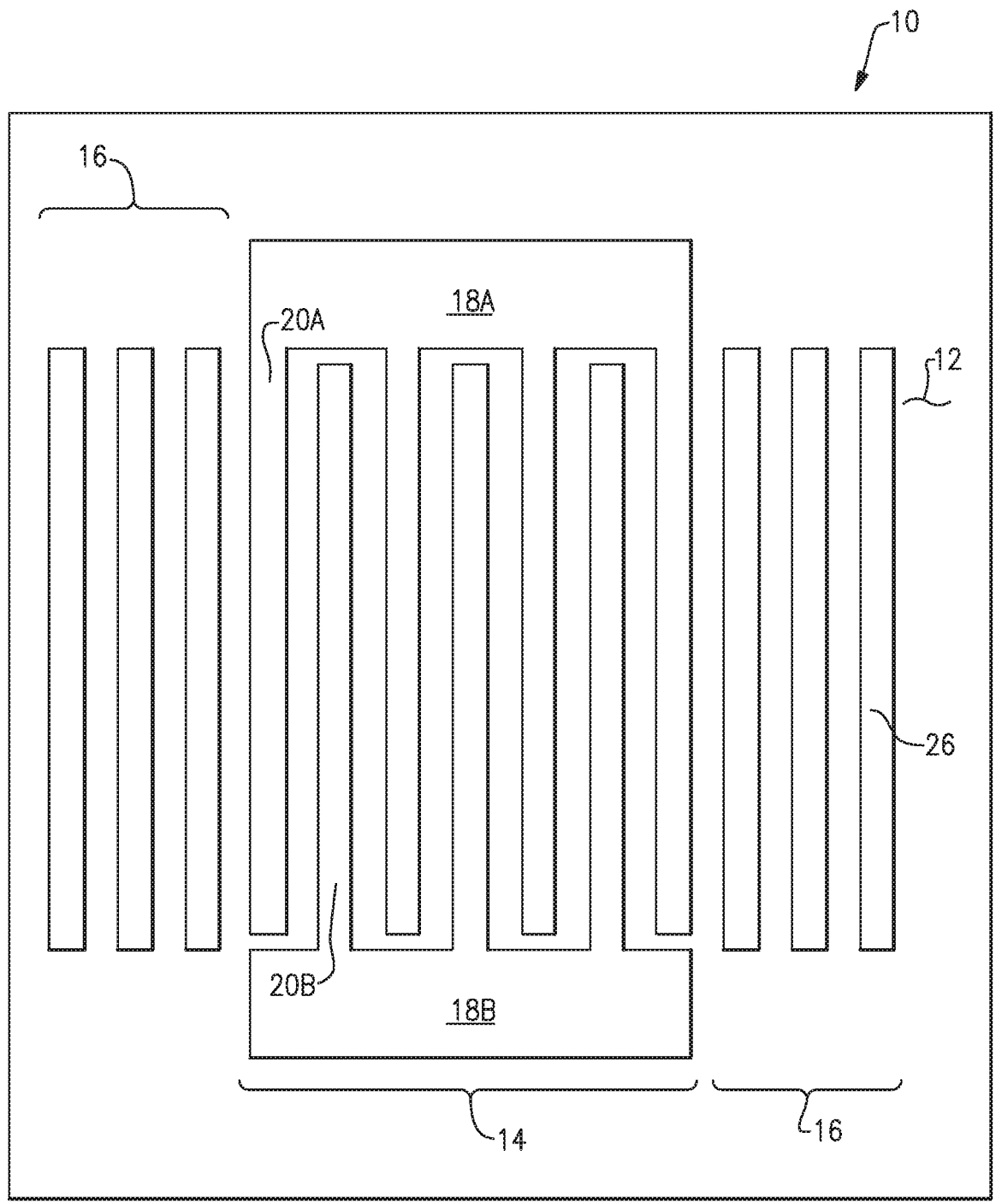
FIG. 1B is a simplified plan view of another example of a surface acoustic wave resonator.
Figure 1C:
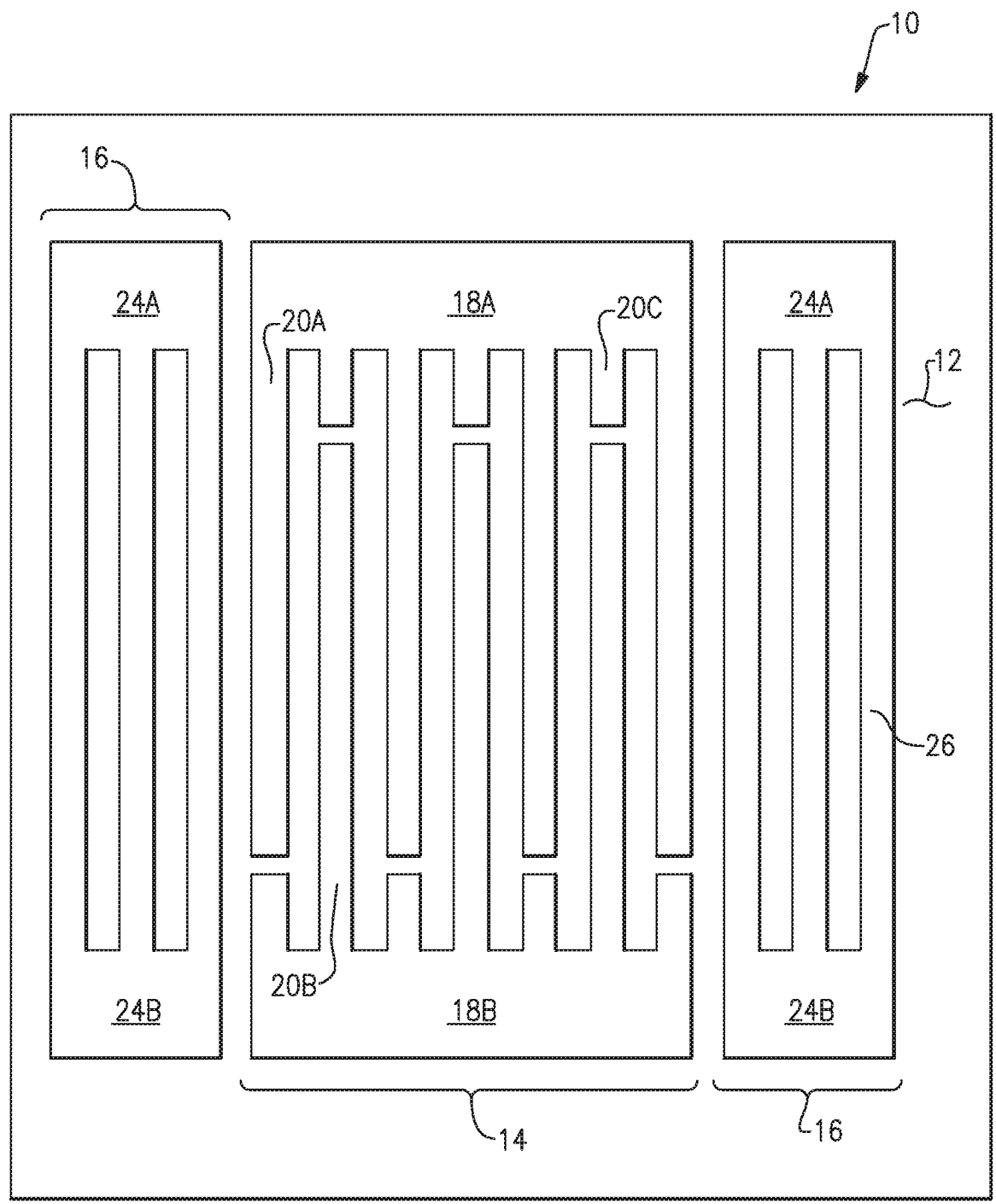
FIG. 1C is a simplified plan view of another example of a surface acoustic wave resonator.

In other embodiments disclosed herein, as illustrated in FIG. 1B, the reflector bus bar electrodes 24A, 24B may be omitted and the reflector fingers 26 may be electrically unconnected. Further, as illustrated in FIG. 1C, acoustic wave resonators as disclosed herein may include dummy electrode fingers 20C that are aligned with respective electrode fingers 20A, 20B. Each dummy electrode finger 20C extends from the opposite bus bar electrode 18A, 18B than the respective electrode finger 20A, 20B with which it is aligned.

It should be appreciated that the acoustic wave resonators 10 illustrated in FIGS. 1A-1C, as well as the other circuit elements illustrated in other figures presented herein, is are illustrated in a highly simplified form. The relative dimensions of the different features are not shown to scale. Further, typical acoustic wave resonators would commonly include a far greater number of electrode fingers and reflector fingers than illustrated. Typical acoustic wave resonators or filter elements may also include multiple IDT electrodes sandwiched between the reflector electrodes.

Operating parameters of SAW devices often vary with temperature. For example, in a radio frequency filter formed of SAW resonators, the resonant and anti-resonant frequencies of the filter may both decrease with temperature. Temperature dependence of parameters of a SAW device is undesirable because one typically would desire a device that operated consistently under different operating conditions. Accordingly, it may be desirable to remove heat generated in a SAW device in operation as quickly and efficiently as possible to keep the device from heating up to a temperature at which the operating parameters of the device shift more than an acceptable amount.

Figure 2:
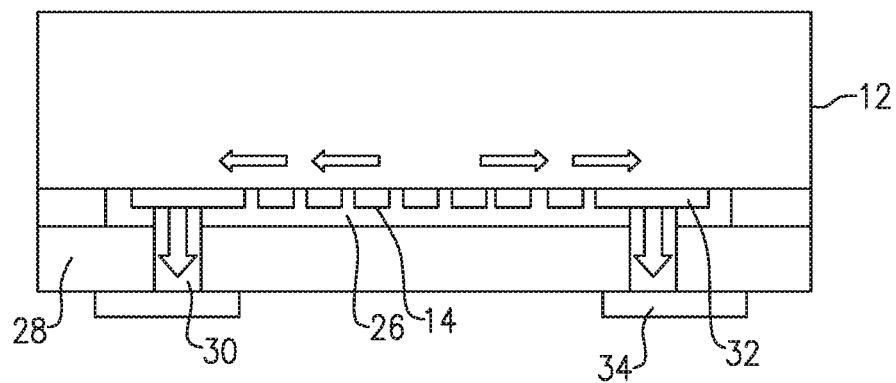
FIG. 2 is a cross-sectional view of an embodiment of a packaged surface acoustic wave device.

One method of packaging a SAW device is illustrated in FIG. 2. A cavity 26 is defined over the portion of the substrate 12 on which the IDT electrodes 14 (and reflector electrodes, not separately illustrated) are disposed by a cap layer and sidewalls of a dielectric material 28, for example, polyimide. Conductive vias 30 are formed through the cap layer of dielectric material and electrically connect to contact pads 32 on the substrate 12 that are in electrical communication with the IDT electrodes 14. The conductive vias 30 provide electrical communication between the contact pads 32 and external bond pads 34 which may be utilized to electrically connect the packaged SAW device to, for example, a circuit board. The conductive vias and external bond pads may be formed of a highly electrically and thermally conductive material, for example, copper. The substrate 12 on which the IDT electrodes 14 are disposed is arranged face down so the side of the substrate 12 including the IDT electrodes 14 faces the external bond pads 34.

When mounted to a circuit board or other external substrate, one path for heat to leave a packaged SAW device is through the external bond pads, for example, bond pads 34 illustrated in FIG. 2, and into the circuit board or other external substrate. To be transferred out of the packaged device, heat generated in portions of the device not in direct contact with the bond pads 34 would have to travel through other portions of the device. Piezoelectric materials, for example, LiTaO$_3$, of which the substrate 12 may be formed, typically have a low thermal conductivity as compared to other materials, for example, metals. A packaged SAW device as illustrated in FIG. 2 may transfer heat out of the device and through the bond pads 34 and the substrate 12 less quickly than might be desirable.

Figure 3:
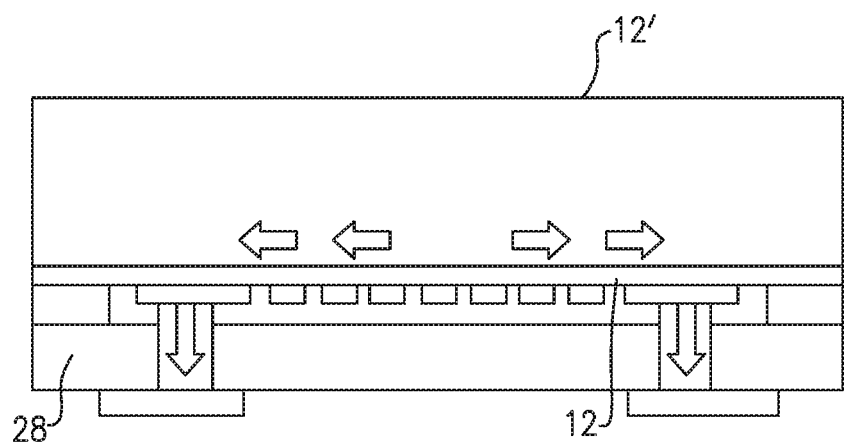
FIG. 3 is a cross-sectional view of another embodiment of a packaged surface acoustic wave device.
Figure 4:
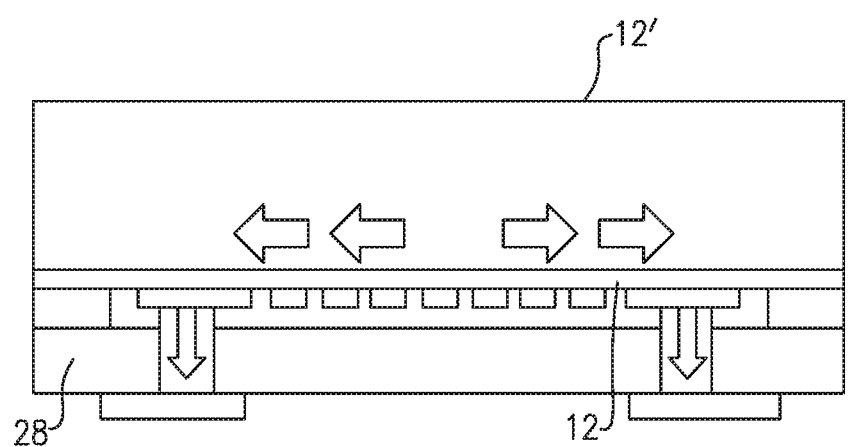
FIG. 4 is a cross-sectional view of another embodiment of a packaged surface acoustic wave device.
Figure 8:
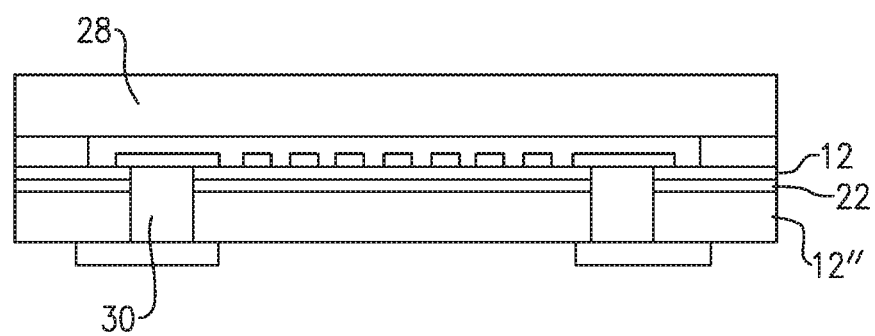
FIG. 8 is a cross-sectional view of another embodiment of a packaged surface acoustic wave device.

One method of increasing the rate and efficiency of heat transfer out of a packaged SAW device as illustrated in FIG. 2 involves increasing the thermal conductivity of the substrate 12. The thermal conductivity of the substrate may be increased by removing a portion of the piezoelectric material of the substrate 12 and replacing it with a layer of dielectric material 12' having a higher thermal conductivity, for example, spinel (MgAl$_2$O$_4$) as illustrated in FIG. 3 or silicon (Si) as illustrated in FIG. 4. Other materials, for example, sapphire, aluminum nitride, silicon dioxide, or diamond could additionally or alternatively be used for the layer of material 12'. The layer of material 12' may be bonded to the piezoelectric material of the substrate 12 with, for example, a layer of silicon dioxide (SiO$_2$) or another suitable bonding material. The bonding layer is illustrated as layer 22 in FIG. 8. The thickness of the piezoelectric material layer should be maintained at a thickness sufficient for the SAW device to perform adequately, for example, between about 0.3 μm and about 50 μm or greater than twice the wavelength λ of a main acoustic wave excited by the IDT electrodes of the SAW device. The layer of material 12' may be between about 50 μm and about 300 μm thick. A layer bonding the piezoelectric material of the substrate 12 to the layer of material 12' may be, for example, between about 0.1 μm and about 50 μm thick.

A comparison of the thermal conductivity of various materials that may be used in embodiments of a packaged SAW device is provided in Table 1 below:

TABLE 1

Comparison of thermal conductivity of selected materials

| Material | Thermal Conductivity (W/mK) |
| --- | --- |
| Lithium tantalate | 2.93 |
| Polyimide | 3.1 |
| Spinel (MgAl$_2$O$_4$) | 16.2 |
| Silicon | 140 |
| Copper | 402 |

Figure 5:
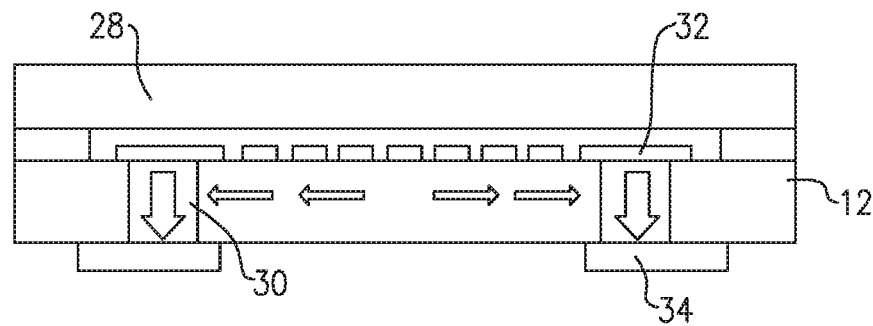
FIG. 5 is a cross-sectional view of another embodiment of a packaged surface acoustic wave device.

An alternate arrangement for a packaged SAW device is illustrated in FIG. 5. The packaged SAW device of FIG. 5 differs from that of FIG. 2 in that the surface of the substrate 12 on which the IDT electrodes 14 are formed faces away from the external bond pads 34 and the conductive vias 30 pass through the substrate 12 rather than through the dielectric material 28, which forms a cap covering a cavity in which the IDT electrodes 14 are disposed. The embodiment of FIG. 5 exhibits similar problems with regard to heat dissipation as FIG. 3. Heat generated in portions of the packaged device not in direct contact with the conductive vias 30 would have to travel, for example, primarily through the low thermal conductivity substrate 12, to the conductive vias to be conducted out of the package. The conductive vias 30 of the embodiment of FIG. 5 may have greater surface area in contact with the material of the substrate 12 and may thus be more efficient at transferring heat out of the substrate 12 and into a circuit board or other external substrate than the packaged SAW device of FIG. 2, however, this increase in heat transfer efficiency may be only minor and less than desirable.

In a similar manner as in the embodiments of FIGS. 3 and 4, a portion of the piezoelectric substrate 12 may be removed and replaced with a layer of dielectric material 12" having a higher thermal conductivity than the piezoelectric material. The layer of material 12" may include spinel (FIG. 6) or silicon (FIG. 7) bonded to the piezoelectric material with, for example, a layer of SiO$_2$. Other materials, for example, sapphire, aluminum nitride, silicon dioxide, or diamond could additionally or alternatively be used for the layer of material 12". The conductive vias 30 pass though both the piezoelectric material portion 12 of the substrate and the layer of material 12". The external bond pads 34 may be disposed on the opposite side (the bottom side) of the layer of material 12" as the piezoelectric material layer 12. The thickness of the piezoelectric material layer in the embodiments of FIGS. 6 and 7 and the thickness of the bonding layer may be the same or similar to that of the embodiments of FIGS. 3 and 4. The thickness of the layer of material 12" in FIGS. 6 and 7 may be less than the thickness of the layer of material 12' in FIGS. 3 and 4. The thickness of the layer of material 12" in FIGS. 6 and 7 may be, for example, between about 50 μm and about 300 μm.

Figure 9:
FIG. 9 is a cross sectional view of an example of a multilayer piezoelectric substrate.

The substrates 12 of the acoustic wave devices disclosed herein may include a single layer of a single piezoelectric material, for example, LiTaO$_3$ or LiNbO$_3$ as illustrated in FIGS. 2-8. It should be appreciated, however, that in some embodiments, the substrates 12 of any of the acoustic wave devices disclosed herein may be multilayer piezoelectric substrates (MPS). As illustrated in FIG. 9, an MPS substrate may include a body having at least one, or two or more, for example, three or more thin film piezoelectric material layers 12A, 12B, 12C. The different layers 12A, 12B, 12C may exhibit at least two different electromechanical coupling coefficients. The central layer 12B may have the largest electromechanical coupling coefficient from among the layers 12A, 12B, 12C. This arrangement may concentrate energy of a surface acoustic wave on a surface of the MPS, so that the electromechanical coupling coefficient of the MPS as a whole is larger than that of each individual piezoelectric material layer. Suitable materials for the different piezoelectric material layers 12A, 12B, 12C may include, for example, ZnO, LiNbO$_3$, LiTaO$_3$, Pb[Zr$_x$Ti1$-_x$]O$_3$ (PZT), PbTiO$_3$, BaTiO$_3$, or Li$_2$B$_4$O$_7$. In some implementations, only a single one of the layers 12A. 12B, 12C or two of the layers 12A, 12B, 12C may include or consist of piezoelectric material and the remaining of the layers 12A, 12B, 12C may comprise or consist of a non-piezoelectric material, for example, a dielectric material.

Figure 10:
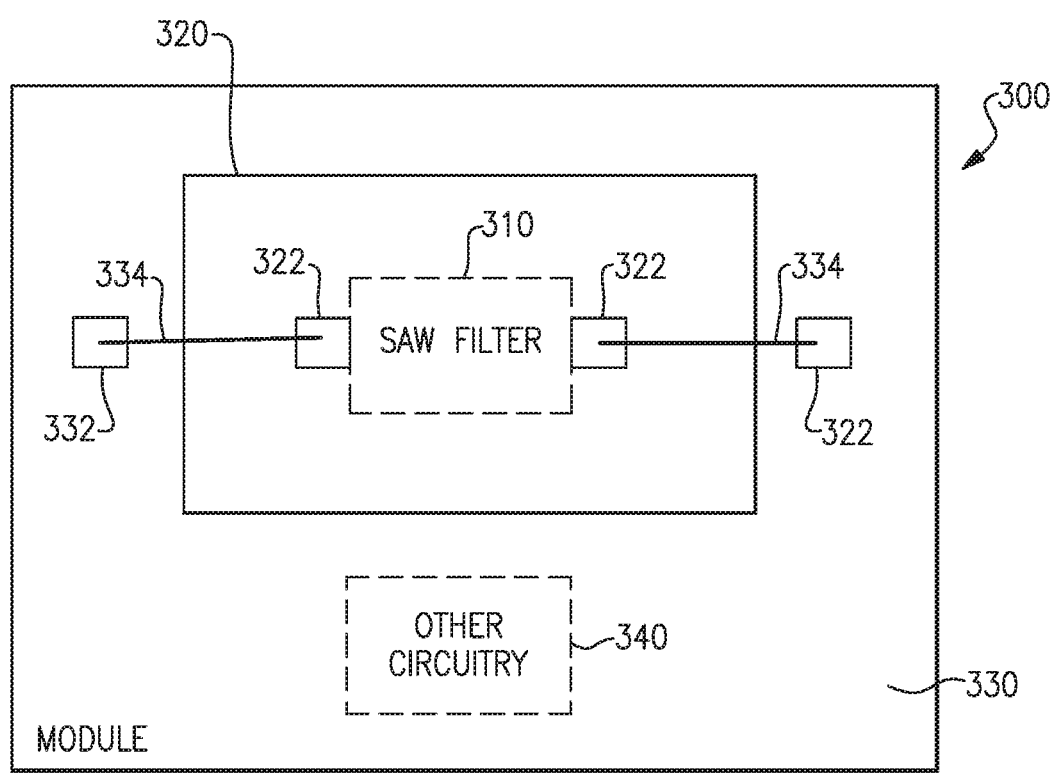
FIG. 10 is a block diagram of one example of a filter module that can include one or more surface acoustic wave elements according to aspects of the present disclosure.
Figure 11:
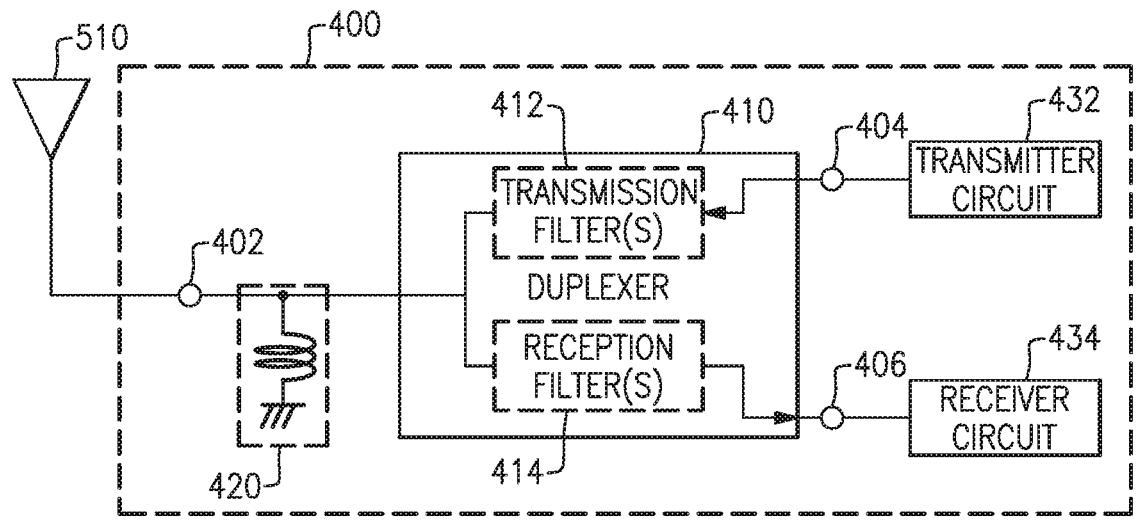
FIG. 11 is a block diagram of one example of a front-end module that can include one or more filter modules according to aspects of the present disclosure.
Figure 12:
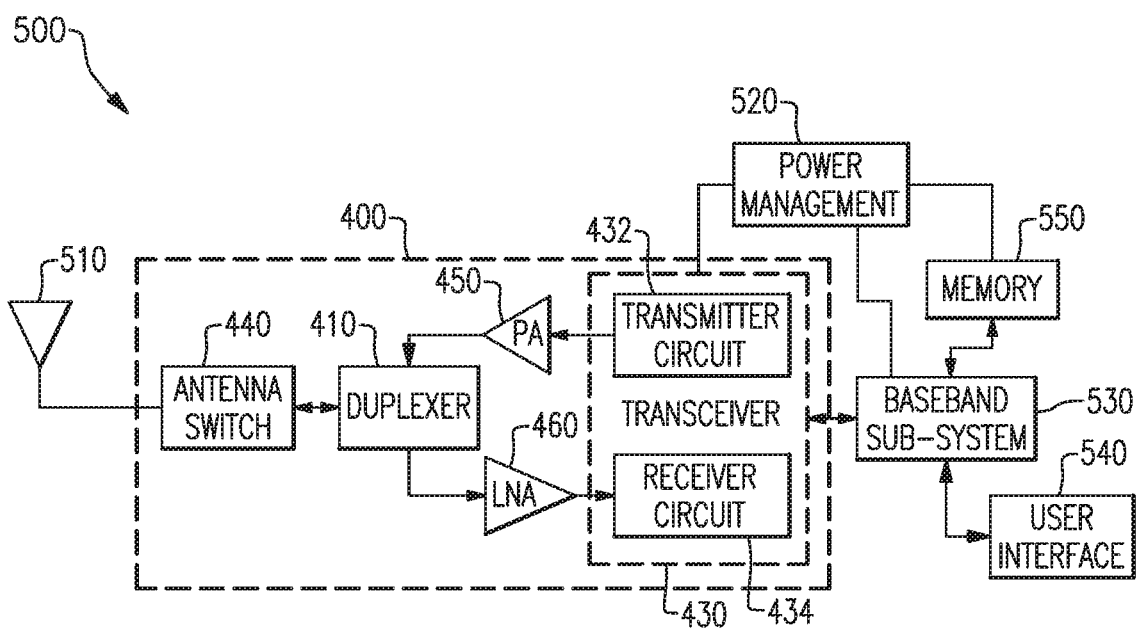
FIG. 12 is a block diagram of one example of a wireless device including the front-end module of FIG. 11.

The acoustic wave devices discussed herein can be implemented in a variety of packaged modules. Some example packaged modules will now be discussed in which any suitable principles and advantages of the packaged acoustic wave devices discussed herein can be implemented. FIGS. 10, 11, and 12 are schematic block diagrams of illustrative packaged modules and devices according to certain embodiments.

As discussed above, embodiments of the surface acoustic wave elements can be configured as or used in filters, for example. In turn, a surface acoustic wave (SAW) filter using one or more surface acoustic wave elements may be incorporated into and packaged as a module that may ultimately be used in an electronic device, such as a wireless communications device, for example. FIG. 10 is a block diagram illustrating one example of a module 300 including a SAW filter 310. The SAW filter 310 may be implemented on one or more die(s) 320 including one or more connection pads 322. For example, the SAW filter 310 may include a connection pad 322 that corresponds to an input contact for the SAW filter and another connection pad 322 that corresponds to an output contact for the SAW filter. The packaged module 300 includes a packaging substrate 330 that is configured to receive a plurality of components, including the die 320. A plurality of connection pads 332 can be disposed on the packaging substrate 330, and the various connection pads 322 of the SAW filter die 320 can be connected to the connection pads 332 on the packaging substrate 330 via electrical connectors 334, which can be solder bumps or wirebonds, for example, to allow for passing of various signals to and from the SAW filter 310. The module 300 may optionally further include other circuitry die 340, such as, for example one or more additional filter(s), amplifiers, pre-filters, modulators, demodulators, down converters, and the like, as would be known to one of skill in the art of semiconductor fabrication in view of the disclosure herein. In some embodiments, the module 300 can also include one or more packaging structures to, for example, provide protection and facilitate easier handling of the module 300. Such a packaging structure can include an overmold formed over the packaging substrate 330 and dimensioned to substantially encapsulate the various circuits and components thereon.

Various examples and embodiments of the SAW filter 310 can be used in a wide variety of electronic devices. For example, the SAW filter 310 can be used in an antenna duplexer, which itself can be incorporated into a variety of electronic devices, such as RF front-end modules and communication devices.

Referring to FIG. 11, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. Examples of the SAW filter 310 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 11, however in other embodiments these components may be integrated into a common transceiver circuit or module. As will be appreciated by those skilled in the art, the front-end module 400 may include other components that are not illustrated in FIG. 11 including, but not limited to, switches, electromagnetic couplers, amplifiers, processors, and the like.

FIG. 12 is a block diagram of one example of a wireless device 500 including the antenna duplexer 410 shown in FIG. 11. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 11. The front-end module 400 includes the duplexer 410, as discussed above. In the example shown in FIG. 12 the front-end module 400 further includes an antenna switch 440, which can be configured to switch between different frequency bands or modes, such as transmit and receive modes, for example. In the example illustrated in FIG. 12, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 10.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 12, the front-end module 400 may further include a low noise amplifier module 460, which amplifies received signals from the antenna 510 and provides the amplified signals to the receiver circuit 434 of the transceiver 430.

The wireless device 500 of FIG. 12 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Example

Figure 13A:
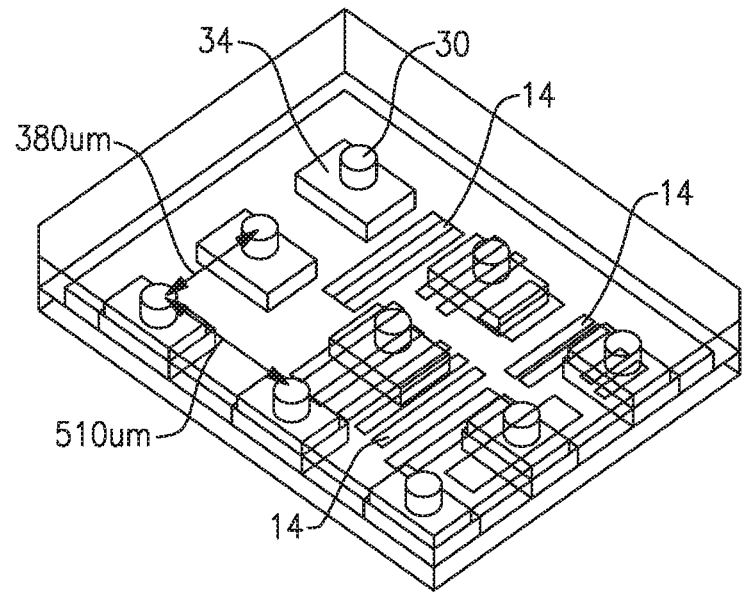
FIG. 13A illustrates details of a simulated packaged surface acoustic wave device used to generate simulations of heat dissipation from the device.
Figure 13B:
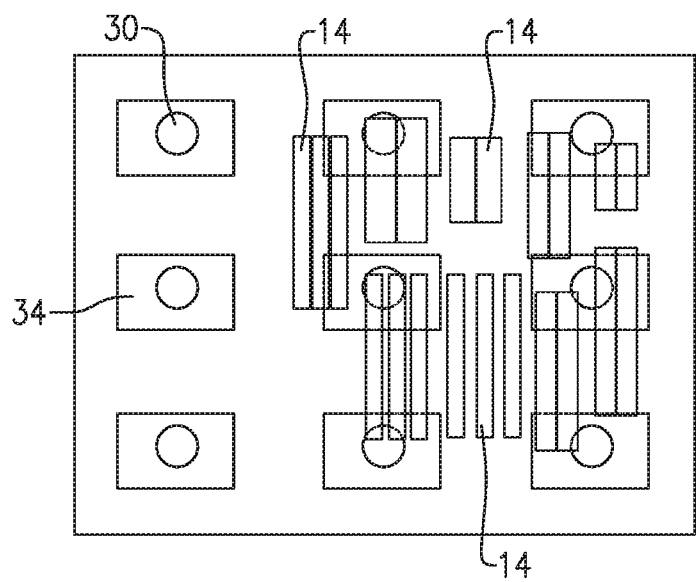
FIG. 13B illustrates further details of the simulated packaged surface acoustic wave device of FIG. 13A.
Figure 13C:
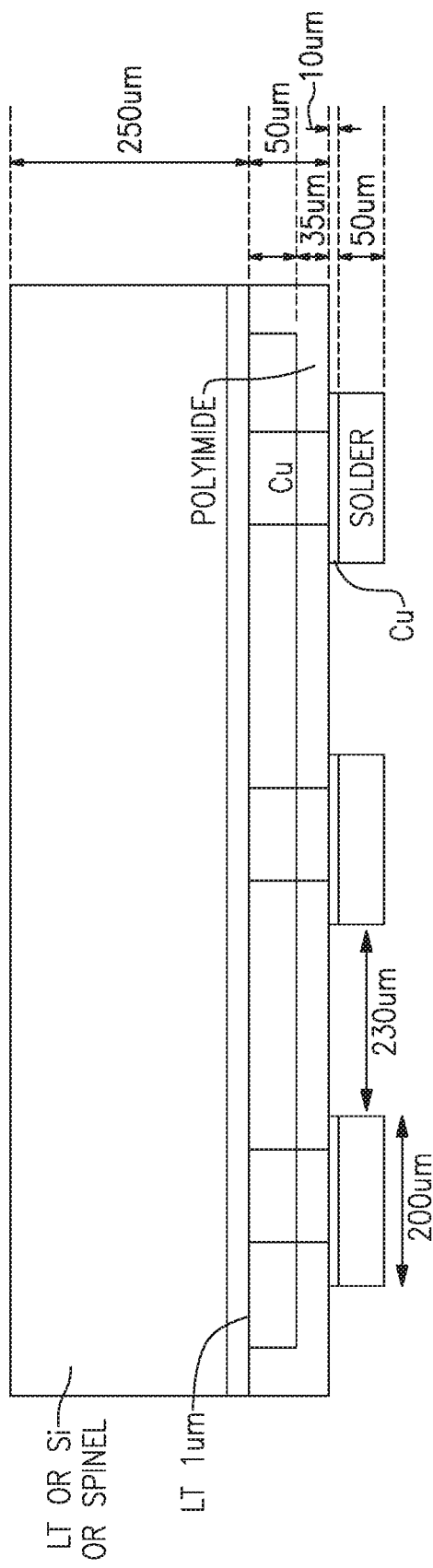
FIG. 13C illustrates further details of the simulated packaged surface acoustic wave device of FIG. 13A.
Figure 14A:
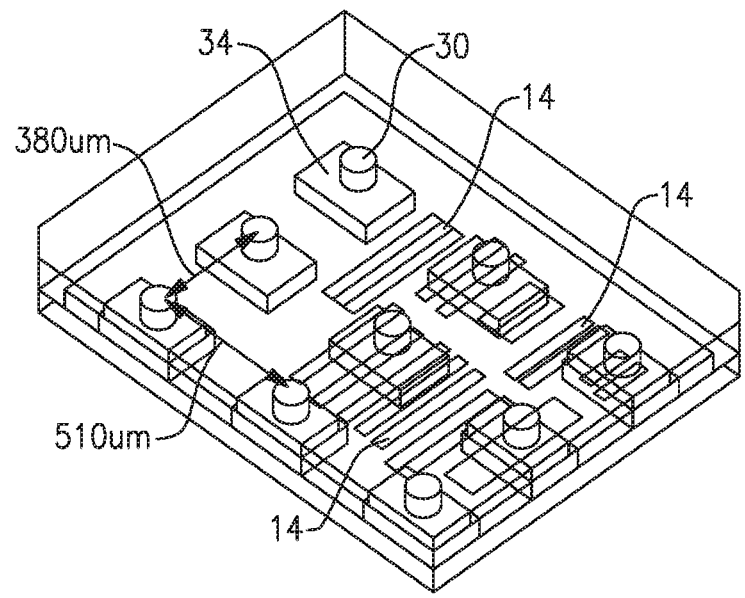
FIG. 14A illustrates details of another simulated packaged surface acoustic wave device used to generate simulations of heat dissipation from the device.
Figure 14B:
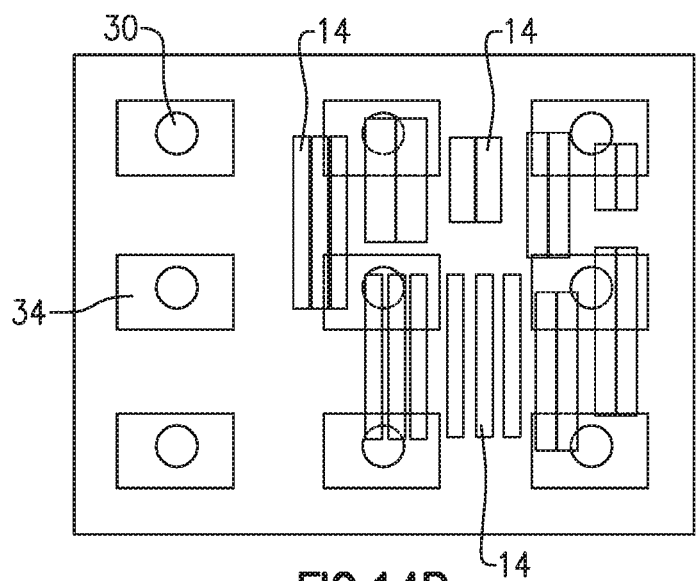
FIG. 14B illustrates further details of the simulated packaged surface acoustic wave device of FIG. 14A.
Figure 14C:
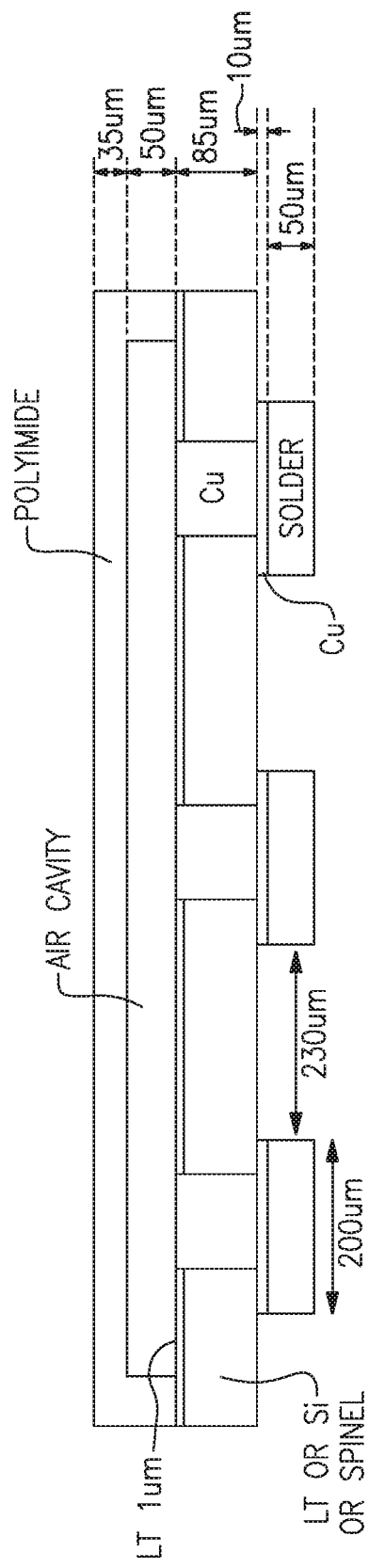
FIG. 14C illustrates further details of the simulated packaged surface acoustic wave device of FIG. 14A.

Simulations were performed to determine the junction thermal resistance R from the IDT electrodes 14 to the external bond pads 34 in each of the embodiments illustrated in FIGS. 2-7. The simulations for the embodiments of FIGS. 2-4 were performed with a simulated device including the materials and dimensions illustrated in FIGS. 13A-13C. The simulations for the embodiments of FIGS. 5-7 were performed with a simulated device including the materials and dimensions illustrated in FIGS. 14A-14C. The results of the simulations were as follows:

TABLE 2

Results of thermal resistance simulations

Figure 6:
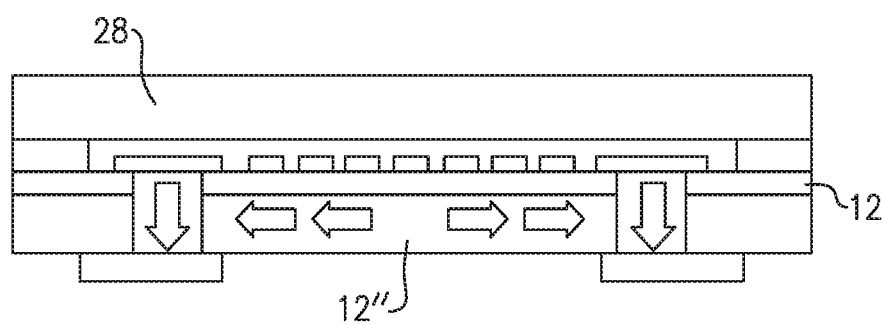
FIG. 6 is a cross-sectional view of another embodiment of a packaged surface acoustic wave device.
Figure 7:
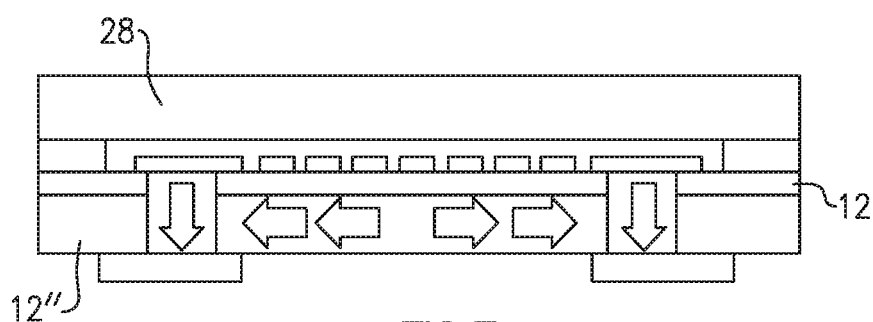
FIG. 7 is a cross-sectional view of another embodiment of a packaged surface acoustic wave device.

| Embodiment | Junction thermal resistance (deg/W) |
|---|---|
| FIG. 2 (flip chip lithium tantalate substrate) | 108 |
| FIG. 3 (flip chip lithium tantalate and spinel layered substrate) | 34 |
| FIG. 4 (flip chip lithium tantalate and silicon layered substrate) | 12.6 |
| FIG. 5 (lithium tantalate substrate) | 84 |
| FIG. 6 (lithium tantalate and spinel layered substrate) | 22.3 |
| FIG. 7 (lithium tantalate and silicon layered substrate) | 6.3 |

These results indicate that packaged SAW devices configured as illustrated in FIGS. 5-7 had more desirable (lower) junction thermal resistance than the corresponding packaged SAW devices of FIGS. 2-4. The junction thermal resistance decreased with increasing thermal conductivity of the material or materials forming the substrates of the packaged devices.

It should be appreciated that the dimensions and features of the simulated devices of FIGS. 13A-13C and 14A-14C are for a device with an operating frequency of between 600 MH and 3.7 GHz. For devices operating at other frequencies the dimensions and features, for example, the number of contacts, thickness of the silicon or spinel or piezoelectric material layers, the number or arrangement of electrode fingers, etc., may vary from what is illustrated herein.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A radio frequency filter comprising:
at least one acoustic wave device, the at least one acoustic wave device including
a layered substrate including a piezoelectric material layer bonded to a second material layer including a material having a higher thermal conductivity than the piezoelectric material layer, the piezoelectric material layer including a multilayer piezoelectric substrate including three layers, a central layer of the three layers having a largest electromechanical coupling coefficient among the three layers,
interdigital transducer electrodes disposed on a surface of the piezoelectric material layer,
contact pads disposed on the piezoelectric material layer and in electrical contact with the interdigital transducer electrodes,
external bond pads disposed on the second material layer and configured to electrically connect the acoustic wave device to a circuit board, and
conductive vias passing through the layered substrate and providing electrical contact between the contact pads and external bond pads.

2. An electronics module comprising:
at least one radio frequency filter including at least one acoustic wave device, the at least one acoustic wave device including
a layered substrate including a piezoelectric material layer bonded to a second material layer including a material having a higher thermal conductivity than the piezoelectric material layer, the piezoelectric material layer including a multilayer piezoelectric substrate including three layers, a central layer of the three layers having a largest electromechanical coupling coefficient among the three layers,
interdigital transducer electrodes disposed on a surface of the piezoelectric material layer,
contact pads disposed on the piezoelectric material layer and in electrical contact with the interdigital transducer electrodes,
external bond pads disposed on the second material layer and configured to electrically connect the acoustic wave device to a circuit board, and
conductive vias passing through the layered substrate and providing electrical contact between the contact pads and external bond pads.

3. An acoustic wave device comprising:
a layered substrate including a piezoelectric material layer bonded to a second material layer including a material having a higher thermal conductivity than the piezoelectric material layer;
interdigital transducer electrodes disposed on a surface of the piezoelectric material layer;
a cavity defined above the interdigital transducer electrodes by walls and a cap including a dielectric material;
contact pads disposed on the piezoelectric material layer within the cavity and in electrical contact with the interdigital transducer electrodes;
external bond pads disposed on the cap on an opposite side of the cap from the cavity; and
conductive vias passing through the cap and providing electrical contact between the contact pads and external bond pads.

4. The acoustic wave device of claim 3 wherein each of the conductive vias pass in a straight line through the layered substrate from the contact pads to the external bond pads.

5. An acoustic wave device comprising:
a layered substrate including a piezoelectric material layer bonded to a second material layer including a material having a higher thermal conductivity than the piezoelectric material layer;
interdigital transducer electrodes disposed on a surface of the piezoelectric material layer;
contact pads disposed on the piezoelectric material layer and in electrical contact with the interdigital transducer electrodes;
external bond pads disposed on the second material layer and configured to electrically connect the acoustic wave device to a circuit board; and
conductive vias passing through the layered substrate and providing electrical contact between the contact pads and external bond pads, each of the conductive vias passing in a straight line through the layered substrate from the contact pads to the external bond pads.

6. The acoustic wave device of claim 5 wherein the second material layer includes a dielectric material.

7. The acoustic wave device of claim 6 wherein the second material layer includes spinel.

8. The acoustic wave device of claim 6 wherein the second material layer includes silicon.

9. The acoustic wave device of claim 5 further comprising a bonding layer that bonds the piezoelectric material layer to the second material layer.

10. The acoustic wave device of claim 9 wherein the bonding layer comprises silicon dioxide.

11. The acoustic wave device of claim 5 wherein the second material layer has a thickness of between about 50 µm and about 150 µm.

12. The acoustic wave device of claim 5 wherein the piezoelectric material layer has a thickness of between about 0.3 µm and about 20 µm.

13. The acoustic wave device of claim 5 configured as a surface acoustic wave resonator.

14. A radio frequency filter including the surface acoustic wave resonator of claim 13.

15. An electronics module including the radio frequency filter of claim 14.

16. An electronic device including the electronics module of claim 15.

17. The acoustic wave device of claim 5 wherein the piezoelectric material layer comprises a multilayer piezoelectric substrate including three layers, a central layer of the three layers having a largest electromechanical coupling coefficient among the three layers.

18. The acoustic wave device of claim 5 wherein each of the conductive vias pass in a straight line through the layered substrate from the contact pads to the external bond pads.

* * * * *

UNITED STATES PATENT AND TRADEMARK OFFICE
CERTIFICATE OF CORRECTION

| | |
|---|---|
| PATENT NO. | : 11,133,789 B2 |
| APPLICATION NO. | : 16/547696 |
| DATED | : September 28, 2021 |
| INVENTOR(S) | : Keiichi Maki et al. |

It is certified that error appears in the above-identified patent and that said Letters Patent is hereby corrected as shown below:

On the Title Page

Item (72) Inventors: delete "Keiichi Maki, Suita (JP)" and insert -- Keiichi Maki, Suita-Shi (JP) --; delete "Rei Goto, Osaka (JP)" and insert -- Rei Goto, Osaka-Shi (JP) --; delete "Hironori Fukuhara, Ibaraki (JP)" and insert -- Hironori Fukuhara, Ibaraki-Shi (JP) --

Signed and Sealed this
Twenty-fifth Day of January, 2022

Drew Hirshfeld
*Performing the Functions and Duties of the*
*Under Secretary of Commerce for Intellectual Property and*
*Director of the United States Patent and Trademark Office*